United States Patent
Pinel et al.

(10) Patent No.: US 8,378,874 B2
(45) Date of Patent: Feb. 19, 2013

(54) MULTI-GIGABIT ANALOG TO DIGITAL CONVERTER

(75) Inventors: Stephane Pinel, Atlanta, GA (US); Joy Laskar, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 73 days.

(21) Appl. No.: 13/056,933

(22) PCT Filed: Jul. 31, 2008

(86) PCT No.: PCT/US2008/071728
§ 371 (c)(1),
(2), (4) Date: Jun. 3, 2011

(87) PCT Pub. No.: WO2010/014094
PCT Pub. Date: Feb. 4, 2010

(65) Prior Publication Data
US 2011/0291872 A1    Dec. 1, 2011

(51) Int. Cl.
*H03M 1/34* (2006.01)
(52) U.S. Cl. .................. 341/158; 341/155; 341/159
(58) Field of Classification Search .............. 341/155, 341/158, 159
See application file for complete search history.

(56) References Cited

U.S. PATENT DOCUMENTS

| | | | | |
|---|---|---|---|---|
| 4,691,189 A | * | 9/1987 | Dingwall et al. | 327/85 |
| 4,989,003 A | * | 1/1991 | Sauer | 341/136 |
| 5,014,059 A | | 5/1991 | Seckora | |
| 5,841,685 A | * | 11/1998 | Kochi | 708/801 |
| 5,936,434 A | * | 8/1999 | Kumamoto et al. | 327/77 |
| 5,951,632 A | * | 9/1999 | Kochi | 708/801 |
| 6,150,850 A | * | 11/2000 | Kinoshita | 327/77 |
| 6,215,325 B1 | | 4/2001 | Southard | |
| 6,661,365 B1 | * | 12/2003 | Bugeja | 341/160 |
| 7,026,972 B2 | | 4/2006 | Isomura | |
| 7,277,039 B2 | | 10/2007 | Yada et al. | |

OTHER PUBLICATIONS

International Search Report and Written Opinion for PCT Application No. PCT/US2008/071728 dated Oct. 31, 2008.

\* cited by examiner

*Primary Examiner* — Khai M Nguyen
(74) *Attorney, Agent, or Firm* — Ryan A. Schneider, Esq.; Troutman Sanders LLP (57) ABSTRACT

An analog to digital converter for operating at high speeds can be implemented with a micro-comparator/sampler, an encoder, and a selector. The micro-comparator includes an input from an antenna of a receiver/transceiver system; a transistor pair; reset transistor; cascaded inverters; an inverter circuit; a buffer; and a D flip flop circuit. Depending on the number of micro-comparator/samplers placed in parallel, a number of bits can be generated. For example, 15 bits from 15 different micro-comparator/samplers can be inserted into a 15 to 4 bit encoder to generate 4 bits.

16 Claims, 10 Drawing Sheets

MULTI-GIGABIT ANALOG TO DIGITAL CONVERTER

CROSS-REFERENCE TO RELATED APPLICATIONS

This application is a 35 U.S.C. §371 United States National Stage Application of International Application No. PCT/US2008/071728, filed 31 Jul. 2008, the contents of which is incorporated herein by reference in its entirety as if fully set forth below.

BACKGROUND

1. Field of the Invention

Embodiments of the present invention relate to an analog to digital converter and, more particularly, to a multi-gigabit analog to digital converter.

2. Description of Related Art

Figure 1:
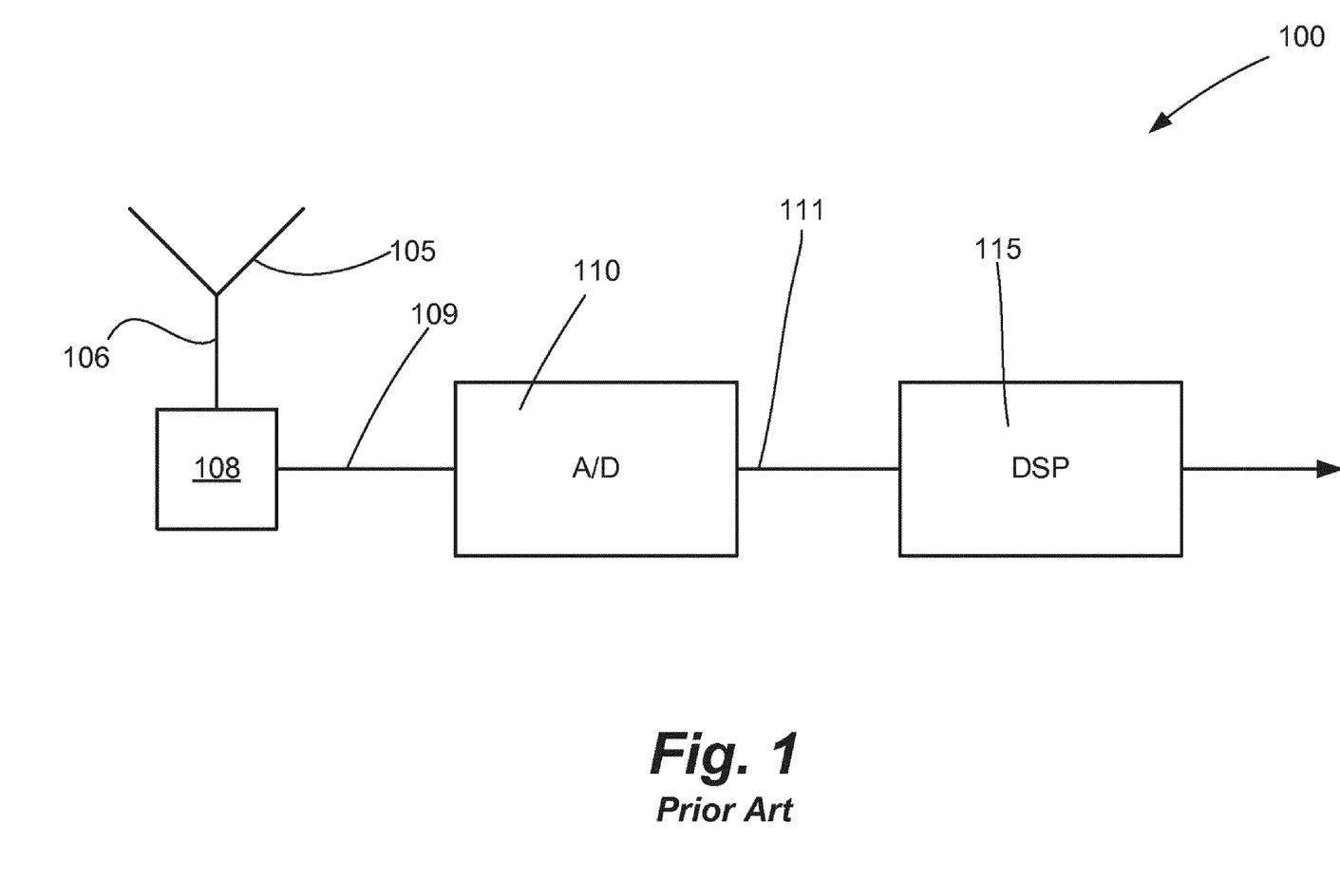
FIG. 1 is a system view of a conventional receiver or transceiver.

Data can be transmitted wirelessly using digital modulation. Typically, a receiver receives a wireless signal, which is ultimately digitized using sampling, and then fed to a digital signal processor. Specifically, as illustrated in FIG. 1, the wireless signal is received by an antenna 105, down converted and then sampled by a high resolution analog-to-digital converter (A/D) 110, and finally processed by the digital signal processor (DSP) 115.

Transmitting digital signals is efficient for data at slow speeds. For instance, transmitting using digital modulation and demodulation is preferred for data being transmitted wirelessly at less than 50 megabits per second (Mbps). When it is desired to transmit at higher speeds, i.e., higher than 50 Mbps, digital demodulation is conventionally undesired, as there are many problems. For instance, because there is a need for both a high-resolution, high-speed A/D and a DSP with digital demodulation, the receiver is expensive, high-power consuming, and requires an undesirable large footprint.

Due to the high potential in terms of multi-gigabit wireless transmission using 57-64 GHz unlicensed frequency band (e.g., 59-64 GHz worldwide) for high-speed data transfer between storage devices, point-to-point video, HDTV, and wireless personal area networking (WPAN) applications, it is desirable to either switch to either use analog techniques or develop a high-resolution, high-speed A/D.

Generally, a very high speed A/D is required to sample the baseband signal, and conventionally there is not an available solution. Further, in the case of multi-gigabit signal, implementation of A/D exhibiting sampling rate more than one Giga-sample-per-second (Gsps) results in undesired high power consumption.

High speed A/Ds require high performing: comparators, sample-and-hold circuits, and encoder circuits. Recently, threshold inverting comparators have been investigated as a potential promising solution for ultra-low power and high-speed operation. Unfortunately, such a solution requires new architecture for sample-and-hold circuits and encoder circuits to maintain intrinsic advantages.

What is needed, therefore, is an improved A/D to provide a compact, robust and power-efficient solution. It is to such a method, device, and system that the present invention is primarily directed.

SUMMARY OF THE INVENTION

Briefly described, embodiments of the present invention relate to an analog to digital converter.

In one embodiment, a low power, ultra-high speed circuit combines comparator and sampling functionality to enable multi-Giga sampling per second (Gsps) operation. Further, the circuit can be combined with a high speed 15 to 4 bit encoder circuit and interleaved topology to enable 4 to 5 bits analog to digital solution, preferably, operating at approximately 4 Gbps (Giga-bits per second) in CMOS (complementary metal oxide semiconductor) 90 nanometer (nm) technology node. The circuit can be adapted to consume less than approximately three milliWatts (mW) total power.

The analog to digital converter can include a micro-comparator/sampler (inverter based thermometer), encoder, and a selector.

In an exemplary embodiment, a micro-comparator/sampler includes a reset transistor; cascaded inverters; an inverter circuit; a buffer circuit; and a D flip flop circuit. The reset transistor comprises a first gate, a first drain, and a first source, and is adapted to reset based on clock signal. The cascaded inverters comprise at least two inverters that are cascadedly-arranged for generating a digital signal. The cascaded inverters include a first input coupled to the first drain of the reset transistor and a first output. The inverter circuit comprises a plurality of inverters, which are coupled to one another in a parallel relationship. Further, the inverter circuit comprises a first input coupled to the output of the cascaded inverters and a first output. The buffer circuit comprises a plurality of buffers, which are coupled to one another in a parallel relationship. In addition, the buffer circuit comprises a first input coupled to the first output of the inverter circuit, and an first output. The D flip flop circuit comprises a D input, a Q output, a notQ output, and a CLK output. The D input of the D flip flop is coupled to the first output of the buffer circuit, and the CLK output of the D flip flop is coupled to the gate of the reset transistor.

A plurality of the micro-comparator/samplers can be arranged in parallel. For example, if fifteen such micro-comparator/samplers are positioned in parallel, fifteen bits can be generated, which can also be converted down to four bits via a 15 to 4 bit encoder.

These and other objects, features and advantages of the present invention will become more apparent upon reading the following specification in conjunction with the accompanying drawing figures.

DETAILED DESCRIPTION

Various embodiments of the present invention relate to devices, methods, and systems for converting an analog signal to a digital signal.

In an exemplary embodiment, a low power, high-speed circuit combines comparator and sampling functionality to enable multi-Giga samples per second operation. The circuit can be adapted to be combined with an encoder and interleaver topology to vary the number of bits desired.

The analog to digital converter can be implemented in a conventional receiver or transceiver system.

Referring, at the outset to FIG. 1, a system view of a conventional receiver/transceiver is shown. The system 100 includes an antenna 105, an analog to digital converter 110, and a digital signal processor 115. The antenna 105 is tuned to receive a particular frequency. For instance, the antenna can be tuned to receive signals at the unlicensed frequency bands, e.g., approximately 57-64 GigaHertz (GHz). The antenna thus will receive analog wireless signals. This received signal can be down-converted via a down converter 108 and coupled to the input 109 of the analog to digital converter 110. The analog to digital converter (A/D) can be implemented in the A/D 110 of the system 100. The output signal 111 generated from the A/D 110 is coupled to the digital signal processor 115, which is a microprocessor for digital signal processing, often real-time computing.

That said, to facilitate an understanding of the principles and features of the embodiments of the invention, they is explained hereinafter with reference to an implementation in an illustrative embodiment. In particular, embodiments of the present invention are described in the context of being an analog to digital converter for high speed applications.

The embodiments, however, are not limited to their use as an analog to digital converter for high speeds. Rather, they can be used when an analog to digital converter is desired or necessary. Thus, the device, system, and method described hereinafter as an analog to digital converter can also find utility for other applications, beyond that of high speeds.

The materials described hereinafter as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

Referring now to the figures, wherein like reference numerals represent like parts throughout the view, embodiments of the analog to digital converter will be described in detail.

Figure 8:
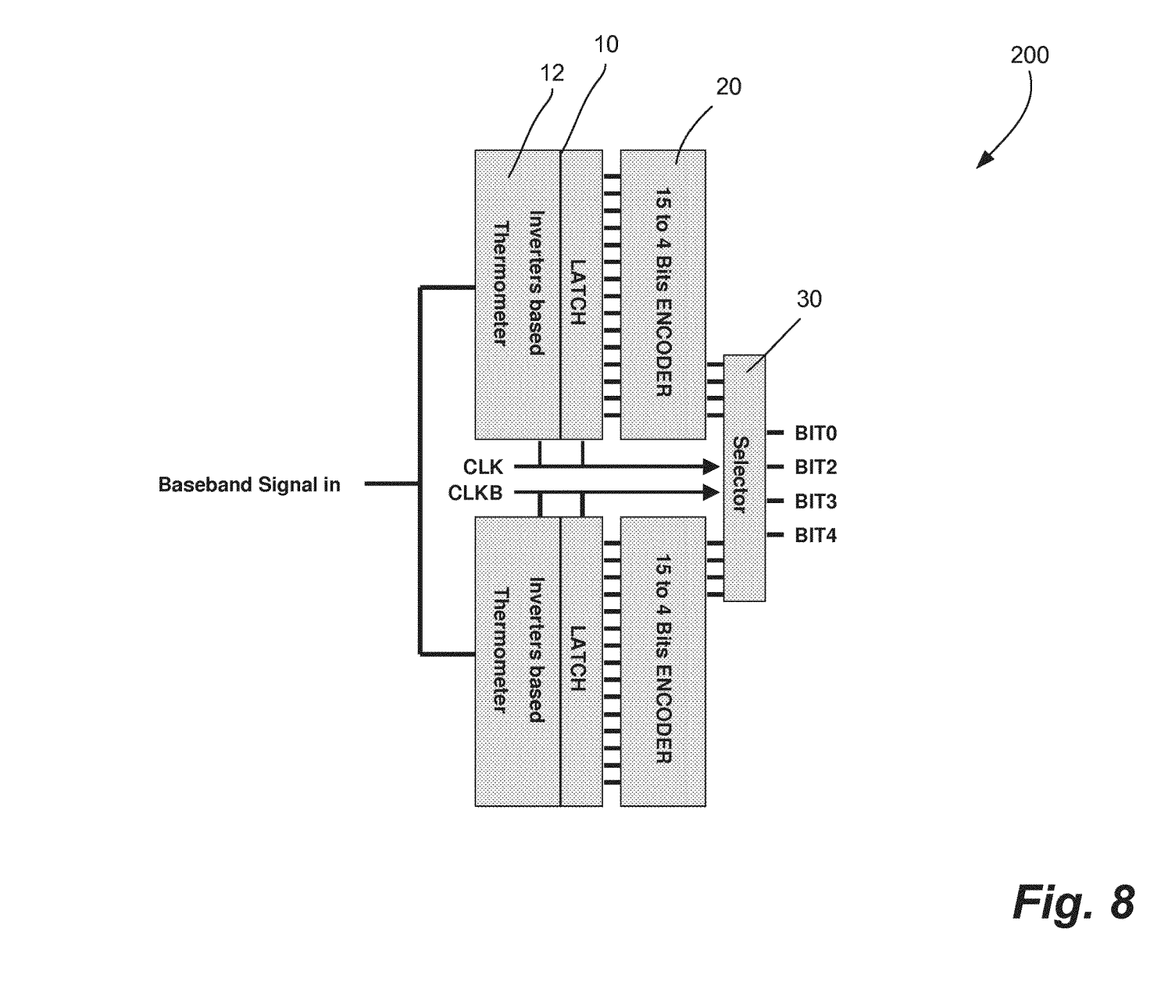
FIG. 8 is a block-diagram of an interleaved analog to digital architecture, in accordance with an exemplary embodiment of the present invention.

As shown in FIG. 8, an analog to digital converter 200 can include a micro-comparator/sample 10 (e.g., an inverter based thermometer), encoder 20, and a selector 30. In one embodiment, the analog to digital converter 200 can replace the analog to digital converter 110 of FIG. 1.

Figure 2:
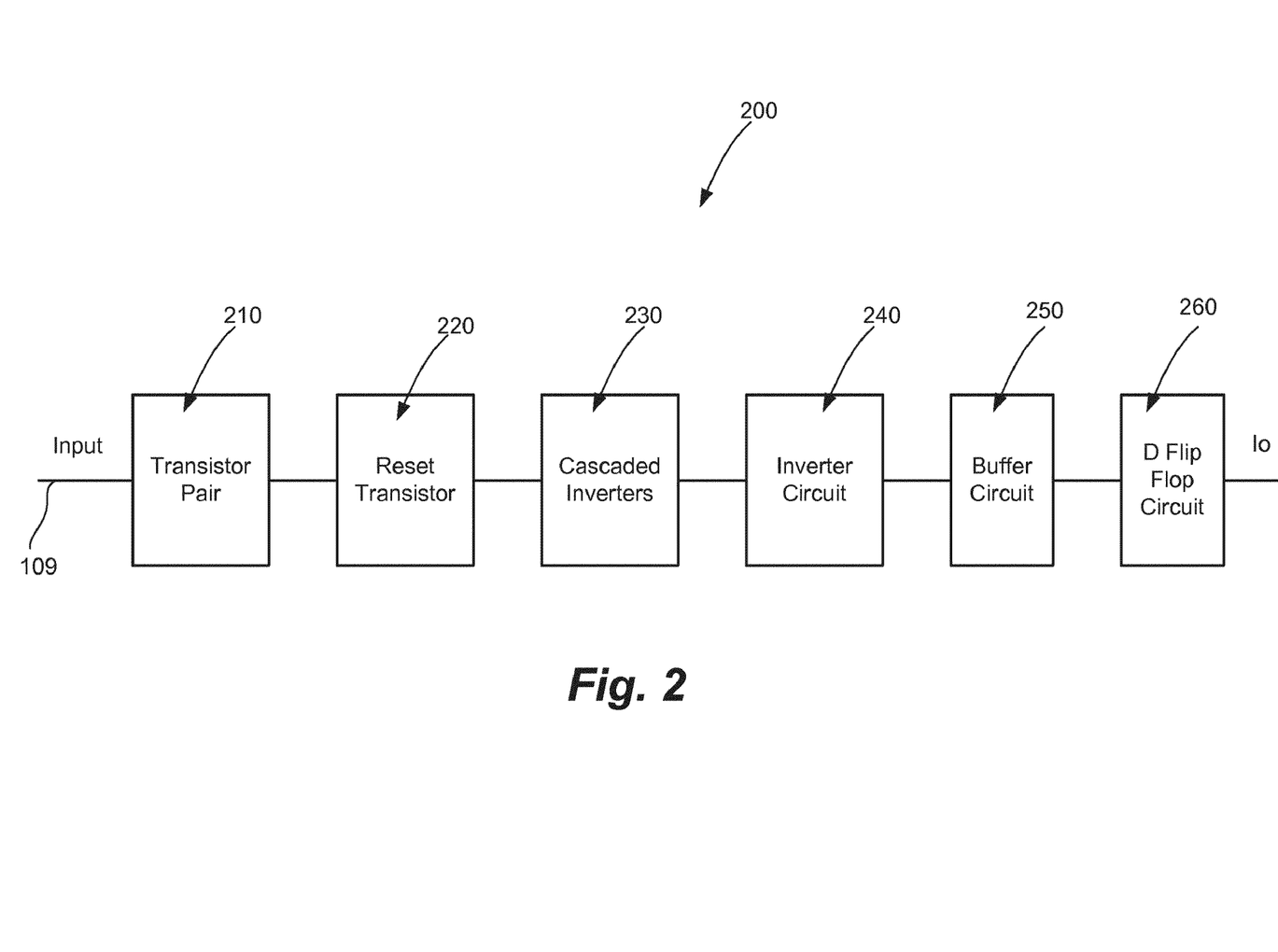
FIG. 2 is a block diagram of a micro-comparator/sampler, in accordance with an exemplary embodiment of the present invention.

Referring now to the block diagram of FIG. 2, the micro-comparator/sampler 10 can include an input 109 from the antenna 105; a transistor pair 210; reset transistor 220; cascaded inverters 230; an inverter circuit 240; a buffer circuit 250; and a D flip flop circuit 260.

Figure 3:
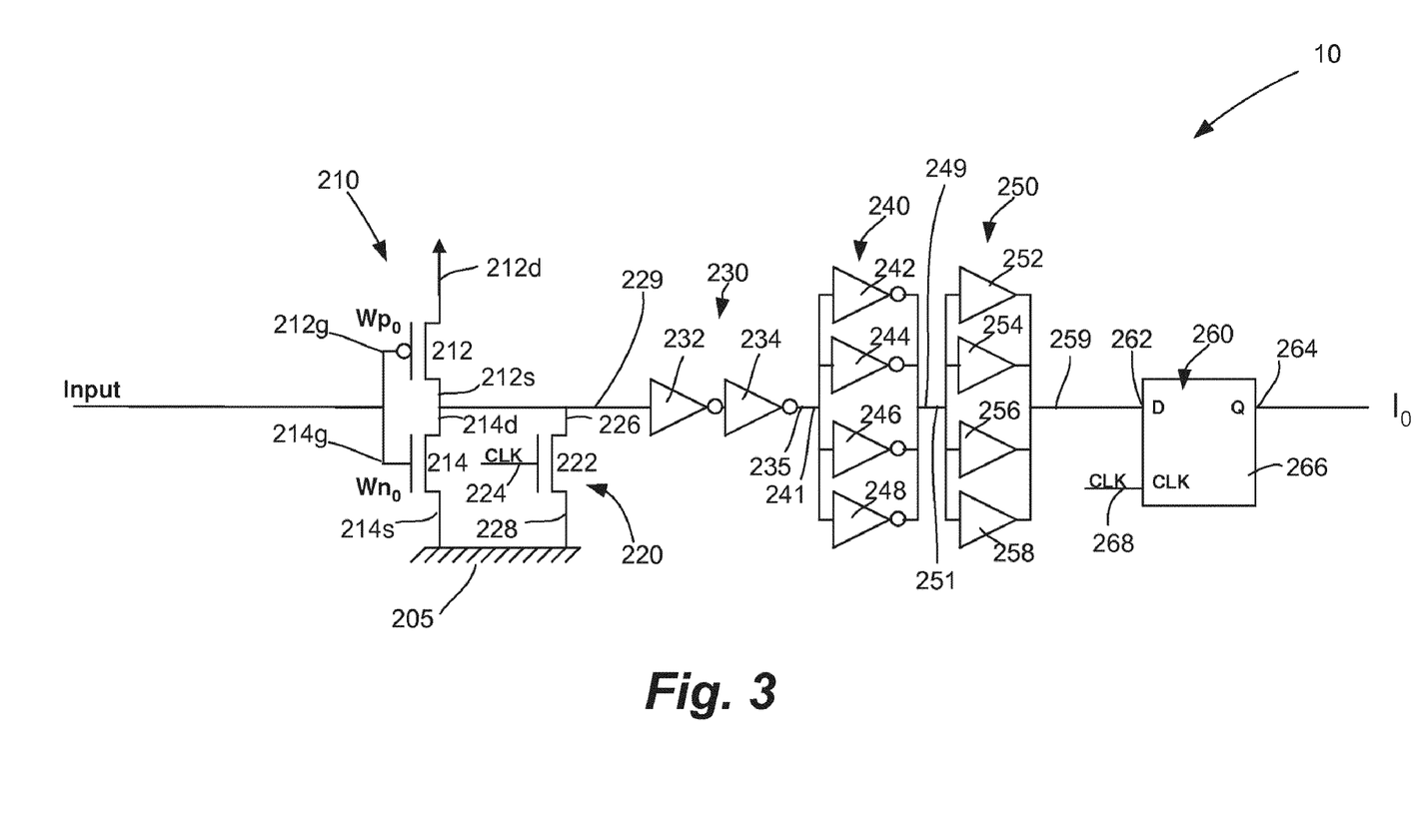
FIG. 3 is a schematic of the micro-comparator/sampler, in accordance with an exemplary embodiment of the present invention.

FIG. 3 illustrates a schematic of the micro-comparator/sampler 10 in an exemplary embodiment.

The reset transistor 220 can comprise a single transistor 222. The reset transistor is adapted to reset the signal of the transistor pair 210, based on a clock signal received from the D flip flop 260. The transistor comprises a gate 224, a drain 226, and a source 228. The transistor 222 can be a field effect transistor (FET), including a metal oxide semiconductor field effect transistor (MOSFET). The source 228 of the transistor 222 is coupled to a ground 205.

The cascaded inverters 230 comprise at least two inverters 232 and 234 that are cascadedly-arranged for generating a digital signal. An inverter is a logic gate that inverts a digital signal driven on its output. Commonly, an inverter is also referred to as a NOT gate. By cascading the two inverters, the result is a NOT-NOT relationship, which generates in the original signal in digital format. The cascaded inverters 230 include an input 229 coupled to the first drain 226 of the reset transistor 220, and a first output 235. Specifically, the first and second inverters 232 and 234, respectively, both include an input and an output. The input to the first inverter 232 is the input 229 to the cascaded inverters 230. The output of the first inverter 232 is coupled to the input of the second inverter 234. The output of the second inverter 234 is the output of the cascaded inverters 230, i.e., output 235. The output 235 of the cascaded inverters 230 is coupled to the input 241 of the inverter circuit 240.

The inverter circuit 240 comprises a plurality of inverters, which are coupled to one another in a parallel relationship. The inverter circuit 240 comprises the first input 241 coupled to the output 235 of the cascaded inverters 230 and an output 249. The output 249 of the inverter circuit 240 is coupled to the input 251 of the buffer circuit 250. In an exemplary embodiment, there are four inverters 242, 244, 246, and 248 positioned in an electrical parallel scheme. As one skilled in the art would appreciate, the number of inverters coupled in parallel in the inverter circuit 240 can vary based on the need or application. The input 241 to the inverter circuit 240 is coupled to each of the parallel inverters 242, 244, 246, and 248. The outputs of each of the inverters 242, 244, 246, and 248 are coupled to generate the output 249 of the inverter circuit 240.

The buffer circuit 250 comprises a plurality of buffers, which are coupled to one another in a parallel relationship. The buffer circuit 250 comprises the input 251 coupled to the output 249 of the inverter circuit 240, and a first output 259. In an exemplary embodiment, there are four buffers 252, 254, 256, and 258 positioned in an electrical parallel scheme. The input 251 to the buffer circuit 250 is coupled to the inputs of each of the parallel buffers 252, 254, 256, and 258. The outputs of each of the buffers 252, 254, 256, and 258 are coupled to generate the output 259 of the buffer circuit 250.

The D flip flop circuit 260 is a sequential device that transfers the value of a D input to the Q output on each rising edge of the clock CLK signal. Accordingly, the D flip flop circuit 260 comprises a D input 262, a Q output 264, a notQ output 266, and a CLK output 268. The D input 262 of the D flip flop circuit 260 is coupled to the output 259 of the buffer circuit 259, and the CLK output 268 of the D flip flop circuit 260 is coupled to the gate 224 of the reset transistor 220. The Q output 264 is the output Io of the micro-comparator/sampler 10.

The micro-comparator/sampler 10 can further include a transistor pair 210 acting as a threshold comparator. The threshold comparator can be synchronized to the clock signal via the reset transistor 220. Synchronization eliminates errors that can arise when the input signal 109 crosses the high or low threshold unsynchronized to the clock. In an exemplary embodiment, the transistor pair 210 can include two transistors 212 and 214. The first transistor 212 includes a gate 212g, a drain 212d, and a second source 212s. The second transistor 214 includes a gate 214g, a drain 214d, and a source 214s. The gate 212g of the first transistor 212 and the gate 214g of the second transistor 214 are coupled to one another. Additionally, the source 212s of the first transistor 212 is coupled to the drain 214d of the second transistor 214, which are coupled to the drain 226 of the reset transistor 220. The source 214s of the second transistor 214 is coupled to the ground 205. And the drain 212d of the first transistor 212 can be coupled to a voltage, such as Vdd.

Figure 4:
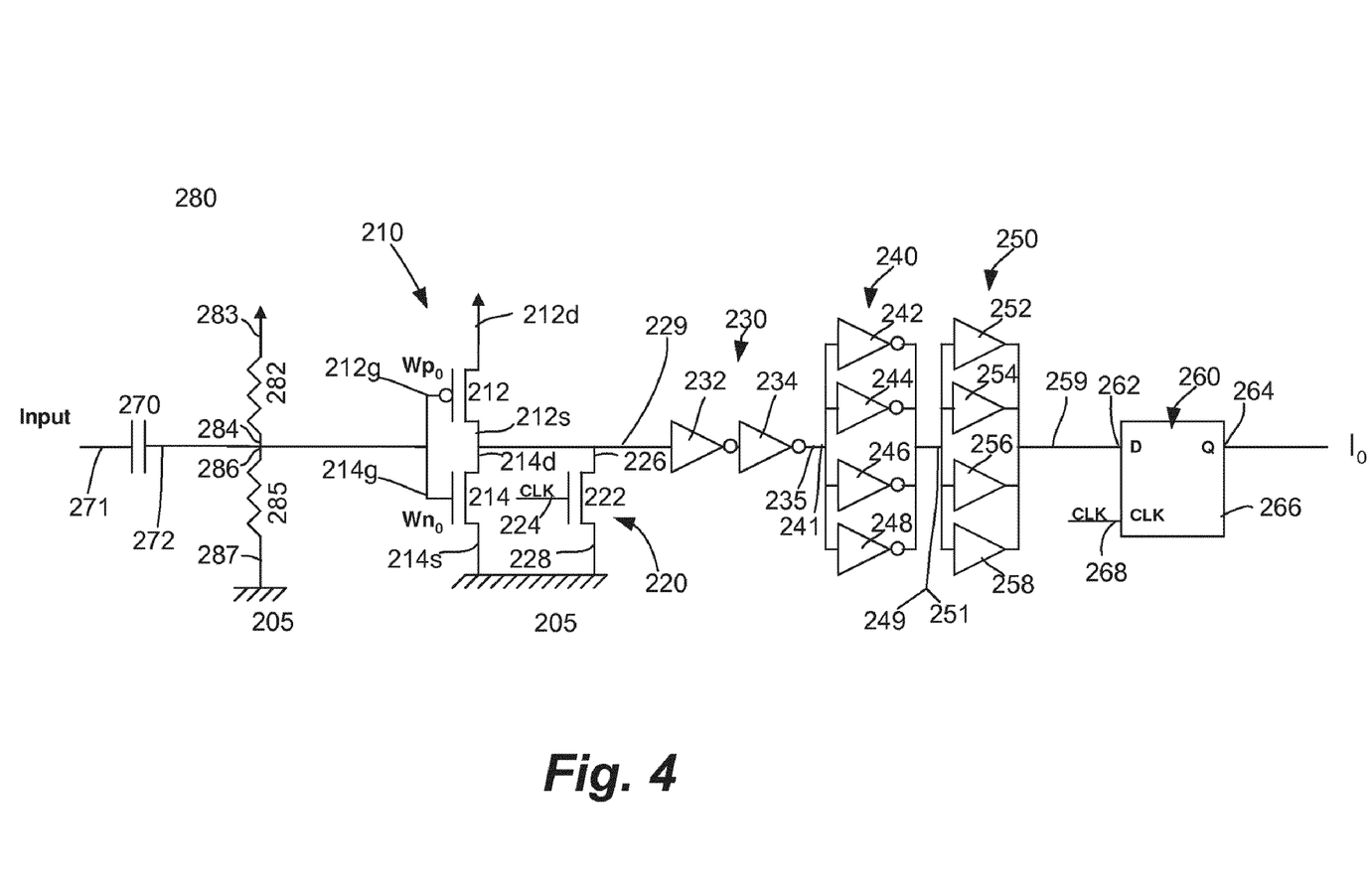
FIG. 4 is another schematic of an micro-comparator/sampler, in accordance with an exemplary embodiment of the present invention.

Referring now to FIG. 4, the micro-comparator/sampler 10 can further include a capacitor 270 and a resistor circuit 280. In one embodiment, the capacitor 270 and/or the resistor circuit 280 can be on-chip with the analog to digital converter 200.

The capacitor 270 includes a first connection 271 and a second connection 272. The first connection 271 is coupled to the input 109 for the micro-comparator/sampler 10, while the second connection 272 is coupled to the resistor circuit 280. In an exemplary embodiment, the capacitance of the capacitor 270 can be approximately 10 pF (picoFarads).

The resistor circuit 280 can comprise first and second resistor 282 and 285. In an exemplary embodiment, the resistors 282 and 285 can be in parallel with one another. The first resistor 282 includes a first connection 283 and a second connection 284. The first connection 283 of the first resistor 282 is coupled to a first voltage, such as Vdd. The second connection 284 of the first resistor 282 is coupled to the second connection 272 of the first capacitor 270. Further, the second resistor 285 includes a first connection 286 being coupled to the second connection 284 of the first capacitor 282, which are ultimately connected to the gates 212g and 214g of the transistors 212 and 214, respectively. The second connection 287 of the second resistor 285 is coupled to ground 205.

When the input voltage 109 to the micro-comparator/sampler 10 reaches the threshold voltage of the inverter circuit 250 the output stage changes. The threshold voltage can depend on a ratio of the transistor pair 210, i.e., $\beta_p/\beta_n$, as indicated below:

$$\beta_n = K_n \frac{W_n}{L_n}$$

$$\beta_p = K_p \frac{W_p}{L_p}$$

$$V_{th} = \frac{V_{dd} + V_{tp} + V_{tn}\sqrt{\beta_n/\beta_p}}{1 + \sqrt{\beta_n/\beta_p}},$$

where $K_n$ and $K_p$ are constant, $V_{tp}$ and $V_{tn}$ are threshold voltages of the transistor pair.

Figure 5:
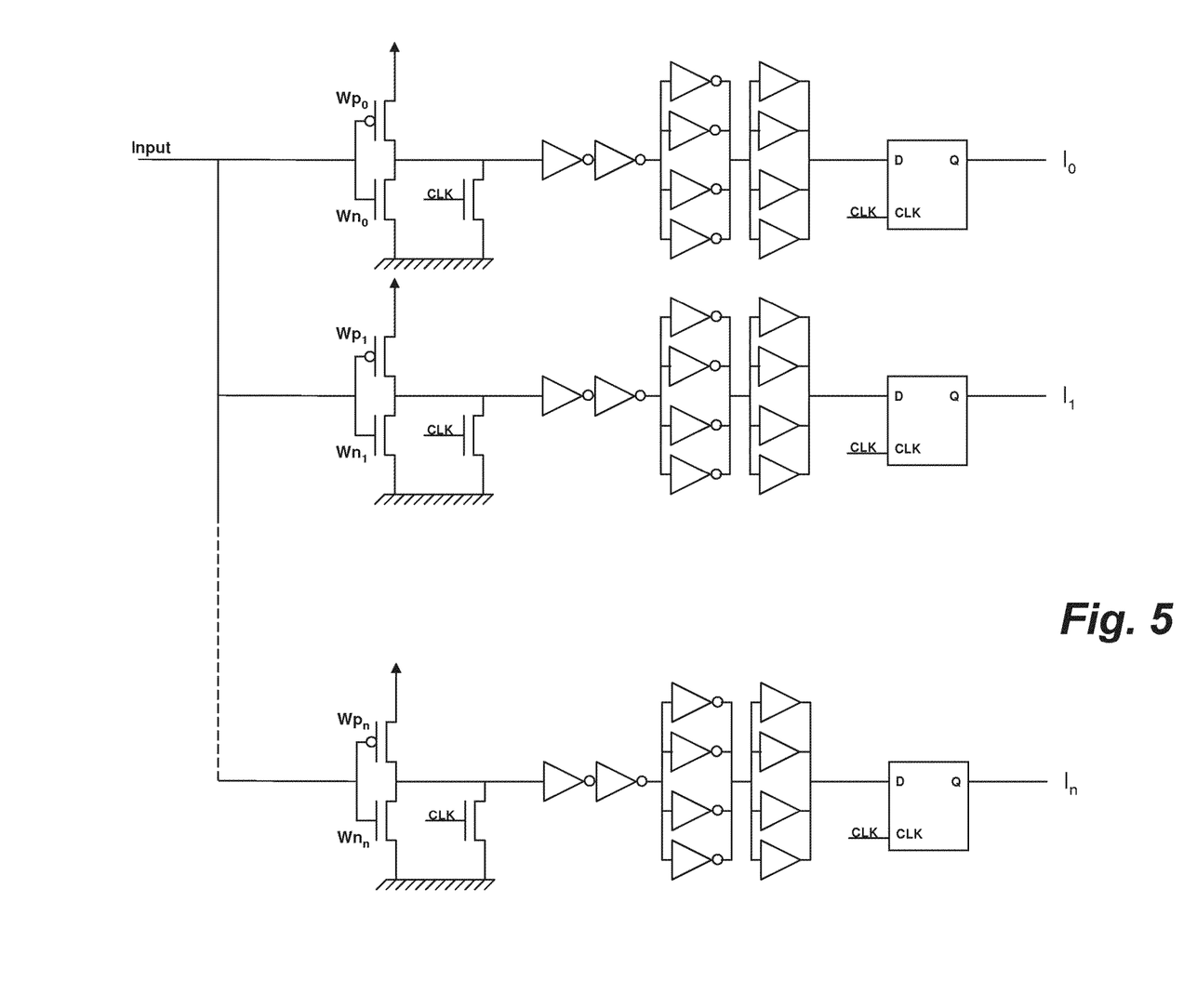
FIG. 5 is a schematic of an n-bit micro-comparator/sampler, in accordance with an exemplary embodiment of the present invention.

A single micro-comparator/sampler 10 generates a single bit. As illustrated in FIG. 5, a number of micro-comparator/samplers 10 can be connected in parallel to form a number of bits. For instance, as illustrated, n-bits can be generating by connecting a plurality of the micro-comparator/sampler circuits 10 in parallel. Generally, this can be referred to as a high-speed thermometer 12. In an exemplary embodiment, 15 micro-comparator/samplers 10 can be connected in a parallel relationship.

Each micro-comparator/sampler is designed with a different $\beta_p/\beta_n$ ratio to provide quantization of the input signal. For example and not limitation, the ratio to quantization of the input can be every 5, 10, 15, or 50 mW. Table 1, below, shows an example of the transistor dimensions for an input signal ($V_{in}$) varying from approximately 480 to 560 mV. Also, in Table 1, $W_n$ is fixed to 0.5 um (i.e., fingers).

TABLE 1

| Comparator No. | $W_p$ (total width in um) | Number of Fingers |
|---|---|---|
| I-0 | 1.3 | 1 |
| I-1 | 1.4 | 1 |
| I-2 | 1.5 | 1 |
| I-3 | 1.61 | 1 |
| I-4 | 1.74 | 1 |
| I-5 | 1.86 | 1 |
| I-6 | 2.15 | 2 |
| I-7 | 2.3 | 2 |
| I-8 | 2.45 | 2 |
| I-9 | 2.63 | 2 |
| I-10 | 2.83 | 2 |
| I-11 | 3.19 | 3 |
| I-12 | 3.46 | 3 |
| I-13 | 3.74 | 3 |
| I-14 | 3.97 | 3 |

Figure 9:
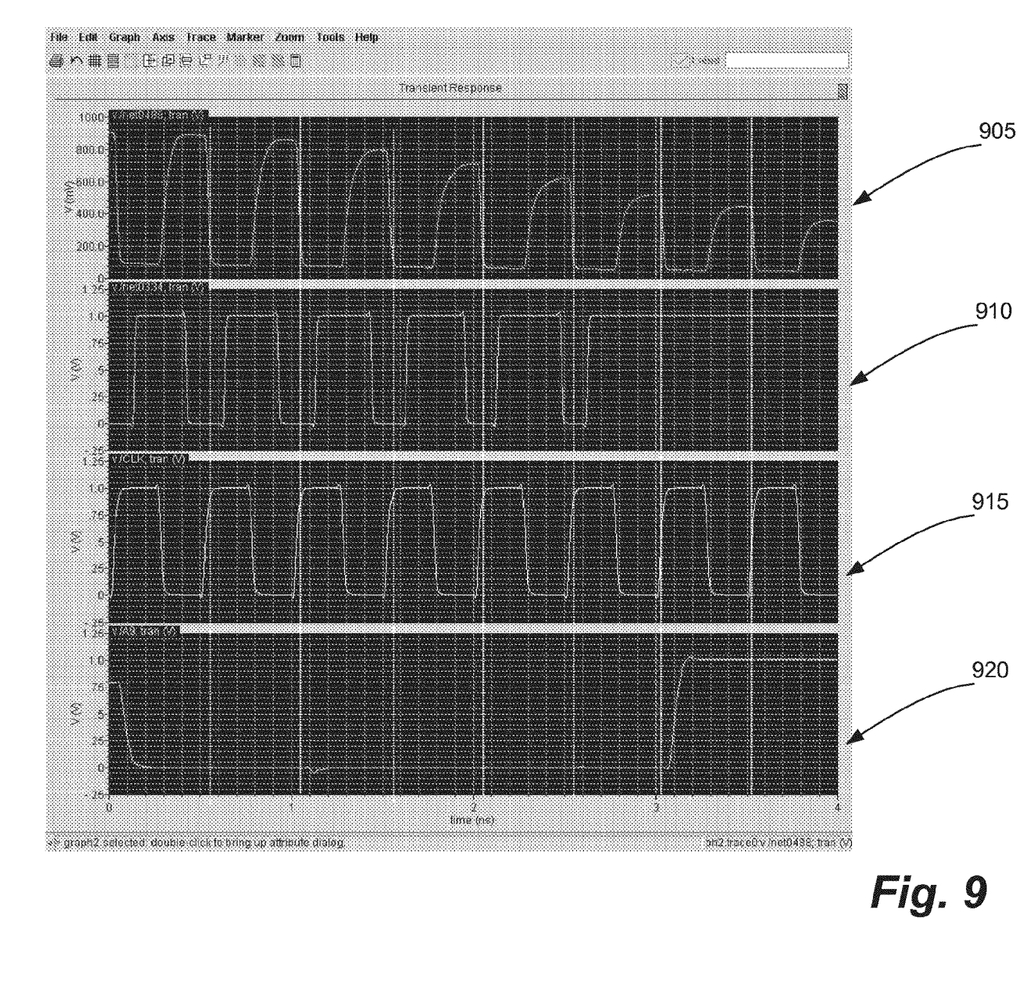
FIG. 9 is a graphical representation of a transient response of a sampler circuit, in accordance with an exemplary embodiment of the present invention.

Referring now to FIG. 9, a typical transient response of a micro-comparator sampler (e.g., Inverter I-9 of Table 1) to a voltage ramp (from 480 mV to 560 mW), using a sampling rate of 2 Gsps (equivalent to 4 Gbps interleaved) is illustrated. The first row 905 (top row) shows the voltage at the output of the threshold inverting comparator I-9. As shown, the signal is not fully digitized yet. After the signal passes the cascaded inverter 230, the inverter circuit 240, and the buffer circuit, the signal is digitized; see row 910. The clock CLK signal is shown in row 915. The output of the D-Flip-flop 260—illustrated in row 920—is "latching" the value of the digital signal—row 910—at the rising clock CLK edge.

Figure 6:
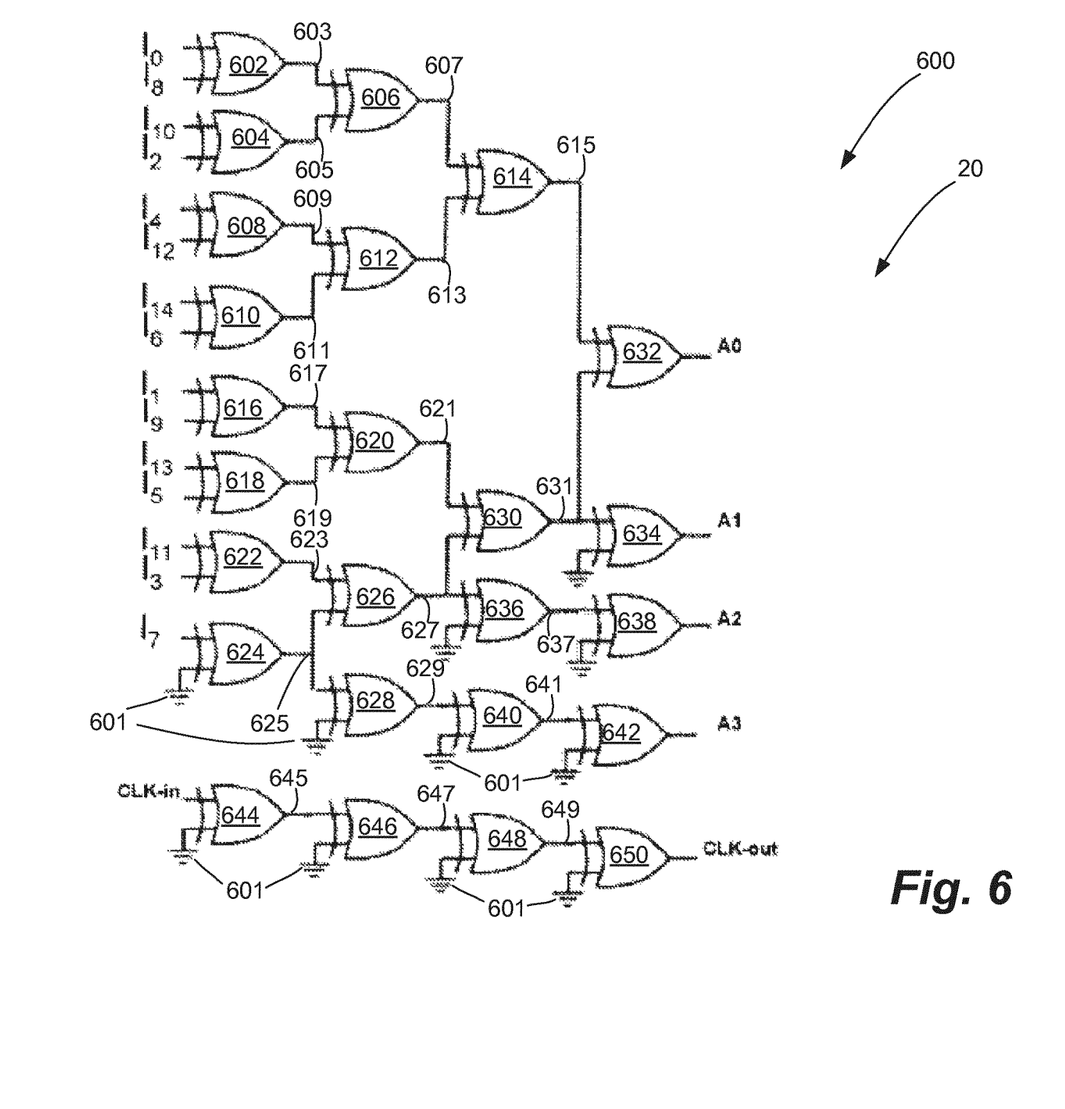
FIG. 6 is a schematic of a high-speed 15 to 4 bit encoder, in accordance with an exemplary embodiment of the present invention.

FIG. 6 illustrates a high speed encoder circuit 600 to form 4 bits analog to digital converter. The signal from the micro-comparator/sampler 10 can be encoded with an encoder 20. Specifically, 15 signals from the micro-comparator/sampler 10 can be encoded based on the 15 to 4 encoder 600 of FIG. 6.

The encoder 600 includes a number of Exclusive OR gates. Gates 602, 604, 606, 608, 610, 612, 614, 616, 618, 620, 622, 624, 626, 628, 630, 632, 634, 636, 638, 640, 642, 644, 646, 648, and 650 are exclusive OR gates.

I-0 and I-8 are input into an Exclusive OR gate 602, which generates signal 603. I-10 and I-2 are input into an Exclusive OR gate 604, which generates signal 605. Signal 603 and signal 605 are input into an Exclusive OR gate 606 to generate signal 607.

I-4 and I-12 are input into an Exclusive OR gate 608, which generates signal 609. I-14 and I-6 are input into an Exclusive OR gate 610, which generates signal 611. Signal 609 and signal 611 are input into an Exclusive OR gate 612 to generate signal 613.

Signals 607 and 613 are input into an Exclusive OR gate 614 to generate signal 615.

I-1 and I-9 are input into an Exclusive OR gate 616, which generates signal 617. I-13 and I-5 are input into an Exclusive OR gate 618, which generates signal 619. Signal 617 and signal 619 are input into an Exclusive OR gate 620 to generate signal 621.

I-11 and I-3 are input into an Exclusive OR gate 622, which generates signal 623. I-7 and a ground 601 are input into an Exclusive OR gate 624, which generates signal 625. Signal 623 and signal 625 are input into an Exclusive OR gate 626 to generate signal 627. Signal 625 and ground 601 are input into an Exclusive OR gate 628 to generate signal 629.

Signal 627 and signal 621 are input into an Exclusive OR gate 630 to generate signal 631. Signal 615 and signal 631 are input into an Exclusive OR gate 632 to generate bit A0.

Signal 631 and ground 601 are input into an Exclusive OR gate 634 to generate bit A1.

Signal 627 and ground 601 are input into an Exclusive OR gate 636 to generate signal 637. Signal 637 and ground 601 are input into an Exclusive OR gate 638 to generate bit A2.

Signal 629 and ground 601 are input into an Exclusive OR gate 640 to generate signal 641. Signal 641 and ground 601 are input into an Exclusive OR gate 642 to generate bit A3.

The CLK-in signal and ground 601 are input into an Exclusive OR gate 644 to generate signal 645. Signal 645 and ground 601 are input into an Exclusive OR gate 646 to generate signal 647. Signal 647 and ground 601 are input into an Exclusive OR gate 648 to generate signal 649. Signal 649 and ground 601 are input into an Exclusive OR gate 650 to generate signal CLK-out.

The four bits—A0, A1, A2, and A3—resulting from the 15 to 4 bit encoder 600 can be then combined with a selector circuit 30.

Figure 7:
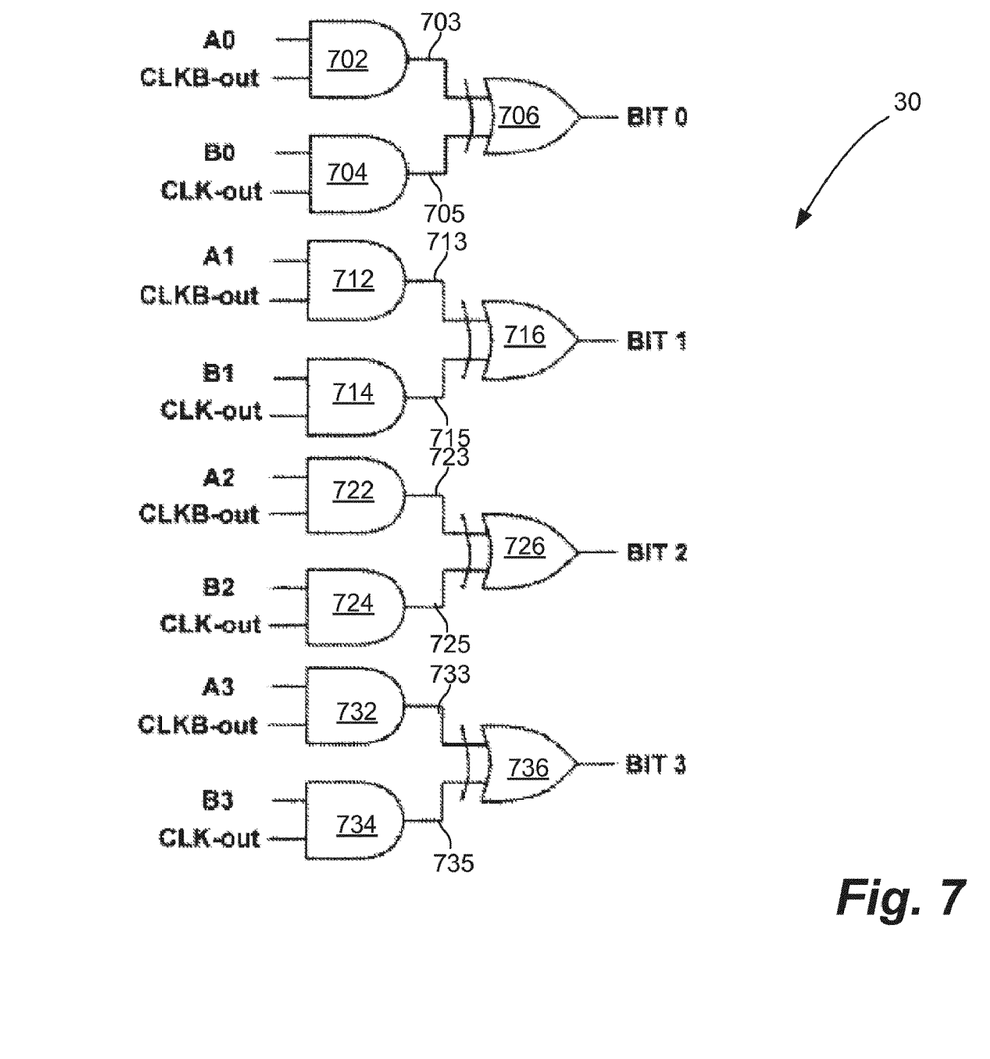
FIG. 7 is a schematic of a selector circuit, in accordance with an exemplary embodiment of the present invention.

As illustrated in FIG. 8, two similar 4 bit circuits can be combined to double the sampling rate and enable 4 Gsps in 90 nm technology. The selector circuit of FIG. 8 is illustrated in FIG. 7.

The first four bits are A0-A3 of a first circuit, while the second four bits B0-B3 are from a second circuit.

The selector 30 selects the signals from each circuit to generate four bits.

Bit A0 and the output clock signal of the second circuit, CLKB-out, are input into an AND gate 702, which generates signal 703. Bit B0 and the output clock signal of the first circuit, CLK-out, are input into an AND gate 704, which generates signal 705. Next, signals 703 and 705 are input into an Exclusive OR gate 706 to generate signal BIT 0.

Bit A1 and the output clock signal of the second circuit, CLKB-out, are input into an AND gate 712, which generates signal 713. Bit B1 and the output clock signal of the first circuit, CLK-out, are input into an AND gate 714, which generates signal 715. Next, signals 713 and 715 are input into an Exclusive OR gate 716 to generate signal BIT 1.

Bit A2 and the output clock signal of the second circuit, CLKB-out, are input into an AND gate 722, which generates signal 723. Bit B2 and the output clock signal of the first circuit, CLK-out, are input into an AND gate 724, which generates signal 725. Next, signals 723 and 725 are input into an Exclusive OR gate 726 to generate signal BIT 2.

Bit A3 and the output clock signal of the second circuit, CLKB-out, are input into an AND gate 732, which generates signal 733. Bit B3 and the output clock signal of the first circuit, CLK-out, are input into an AND gate 734, which generates signal 735. Next, signals 733 and 735 are input into an Exclusive OR gate 736 to generate signal BIT 3.

Figure 10:
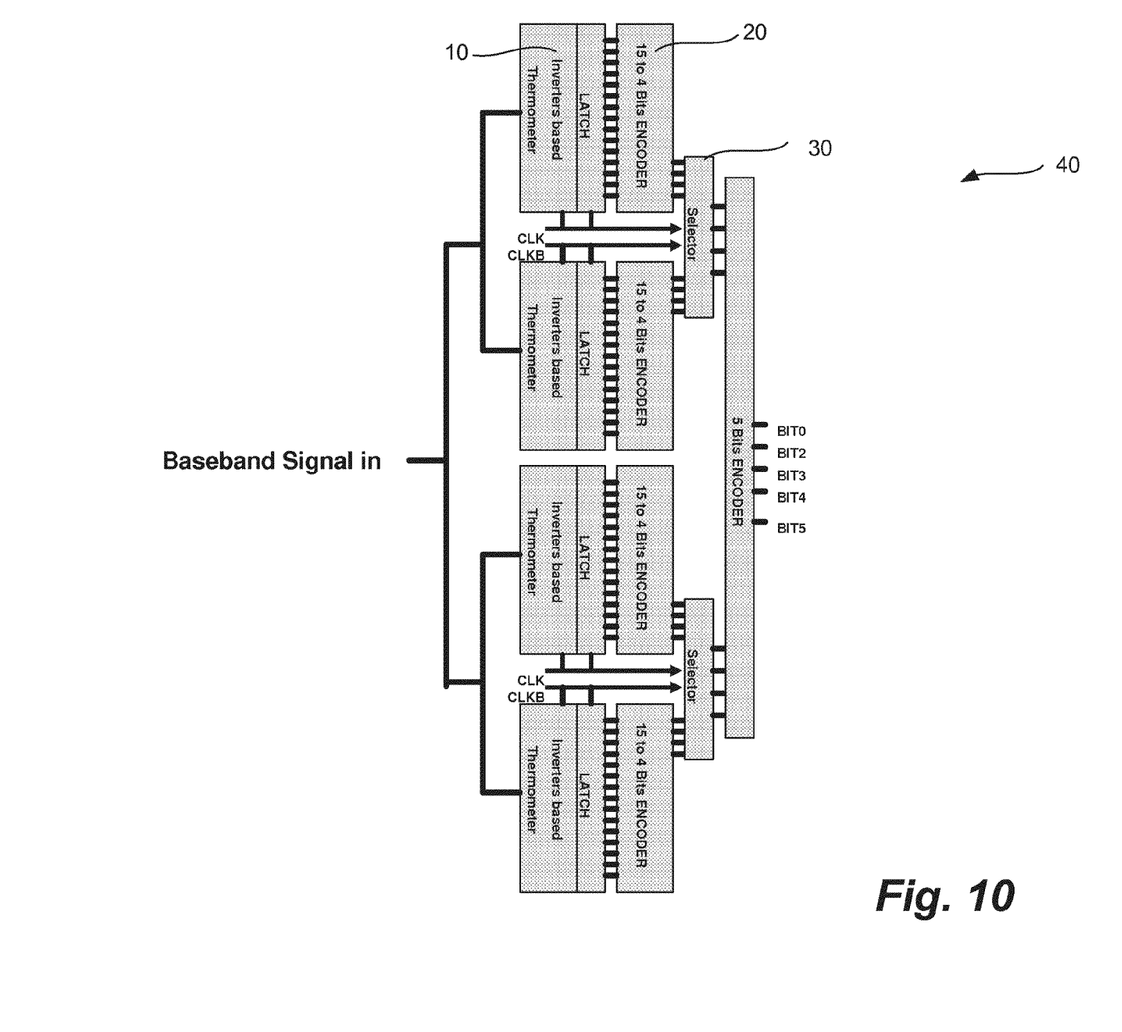
FIG. 10 is a block-diagram of a five bits interleaver analog to digital architecture, in accordance with an exemplary embodiment of the present invention.

The resolution of the analog to digital converter can be increased to 5 bits by combining two identical circuits 40 as illustrated in FIG. 10, which comes at the expense of input capacitance and reducing the input bandwidth.

Whereas the above-described embodiments have been described in detail with the accompanying figures, it will be understood that various changes from these embodiments can be made without departing from the scope or spirit of the invention, which is set forth in the following claims.

What is claimed is:

1. An analog to digital converter comprising:
   a reset transistor comprising a first gate, a first drain, and a first source;
   at least two inverters cascadedly-arranged for amplifying and generating a digital signal, the cascaded inverters comprising a first input coupled to the first drain of the reset transistor, and a first output;
   a inverter circuit comprising a plurality of inverters, the plurality of inverters are coupled to one another in a parallel relationship, the inverter circuit comprising a first input coupled to the output of the cascaded inverters and a first output;
   a buffer circuit comprising a plurality of buffers, the plurality of buffers are coupled to one another in a parallel relationship, the buffer circuit comprising a first input coupled to the first output of the inverter circuit and a first output; and
   a D flip flop circuit comprising a D input, a Q output, a notQ output, and a CLK output, the D input is coupled to the first output of the buffer circuit, and the CLK output is coupled to the gate of the reset transistor.

2. The analog to digital converter of claim 1, further comprising:
   a transistor pair comprising a first transistor and a second transistor,
   the first transistor comprising a second gate, a second drain, and a second source; and
   the second transistor comprising a third gate, a third drain, and a third source,
   the second gate of the first transistor and the third gate of the second transistor are coupled to one another,
   the second source of the first transistor is coupled to the third drain of the second transistor, which are coupled to the first drain of the reset transistor.

3. The analog to digital converter of claim 2, the second drain of the first transistor of the transistor pair is coupled to a voltage source, and the third source of the second transistor of the transistor pair is coupled to a ground signal.

4. The analog to digital converter of claim 1, further comprising:
   a first capacitor having a first connection and a second connection, the first connection being coupled to an input signal to the analog to digital converter; and
   a resistor circuit coupled to the second connection of the first capacitor, the resistor circuit comprising:
      a first resistor having a first connection and a second connection, the first connection of the first resistor coupled to a voltage source and the second connection of the first resistor coupled to the second connection of the first capacitor, and
      a second resistor having a first connection coupled to the second connection of the first capacitor and a second connection being coupled to a ground.

5. A device comprising a plurality of analog to digital converters of claim 1.

6. The device of claim 5, wherein the plurality of analog to digital converters are arranged in an electrically parallel relationship.

7. The device of claim 6, wherein there are a total of 15 analog to digital converters.

8. The device of claim 7, further comprising a high speed 15 to 4 bit encoder to generate four bits.

9. A device comprising a plurality of analog to digital converters of claim 4.

10. The device of claim 9, wherein the plurality of analog to digital converters are arranged in an electrically parallel relationship.

11. The device of claim 10, wherein there are a total of 15 analog to digital converters.

12. The device of claim 11, further comprising a high speed 15 to 4 bit encoder to generate four bits.

13. An analog to digital converter comprising:
an encoder; and
a plurality of micro-comparator/samplers comprising:
   a reset transistor comprising a first gate, a first drain, and a first source;
   at least two inverters cascadedly-arranged for generating a digital signal, the cascaded inverters comprising a first input coupled to the first drain of the reset transistor, and a first output;
   a inverter circuit comprising a plurality of inverters, the plurality of inverters are coupled to one another in a parallel relationship, the inverter circuit comprising a first input coupled to the output of the cascaded inverters and an first output;
   a buffer circuit comprising a plurality of buffers, the plurality of buffers are coupled to one another in a parallel relationship, the buffer circuit comprising a first input coupled to the first output of the inverter circuit, and an first output; and
   a D flip flop circuit comprising a D input, a Q output, a notQ output, and a CLK output, the D input is coupled to the first output of the buffer circuit, and the CLK output is coupled to the gate of the reset transistor.

14. The analog to digital converter of claim 13, the plurality of micro-comparator/samplers are in a parallel relationship with one another.

15. The analog to digital converter of claim 14, wherein there are 15 micro-comparator/samplers, and wherein the encoder is a 15 to 4 bit encoder adapted to encode the 15 micro-comparator/samplers to 4 bits.

16. The analog to digital converter of claim 15, further comprising a selector for doubling sampling rate.

\* \* \* \* \*